United States Patent [19]
Chinnaswamy et al.

[11] Patent Number: 5,313,623
[45] Date of Patent: May 17, 1994

[54] METHOD AND APPARTUS FOR PERFORMING DIAGNOSIS SCANNING OF A MEMORY UNIT REGARDLESS OF THE STATE OF THE SYSTEM CLOCK AND WITHOUT AFFECTING THE STORE DATA

[75] Inventors: Kumar Chinnaswamy, Milford; Hansel A. Collins, Clinton; Michael B. Evans, Marlborough; Timothy P. Fissette, Westminster; Michael A. Gagliardo, Shrewsbury; John J. Lynch, Wayland; James E. Tessari, Arlington, all of Mass.

[73] Assignee: Digital Equipment Corporation, Maynard, Mass.

[21] Appl. No.: 547,656

[22] Filed: Jul. 3, 1990

[51] Int. Cl.⁵ .............................................. G06F 11/22
[52] U.S. Cl. .................................. 395/575; 371/22.3; 364/DIG. 1; 364/265.3
[58] Field of Search .................. 364/DIG. 1, DIG. 2; 371/21.1, 22.1, 22.3; 395/575

[56] References Cited

U.S. PATENT DOCUMENTS

| | | | |
|---|---|---|---|
| 3,911,402 | 10/1975 | McLean et al. | 395/325 |
| 3,970,993 | 7/1976 | Finnila | 395/800 |
| 4,305,125 | 12/1981 | Sato et al. | 395/575 |
| 4,322,846 | 3/1982 | Carroll | 371/16.1 |
| 4,342,084 | 7/1982 | Sager et al. | 371/22.3 |
| 4,471,427 | 9/1984 | Harris | 395/275 |
| 4,575,792 | 3/1986 | Keeley | 395/575 |
| 4,590,551 | 5/1986 | Mathews | 395/200 |
| 4,710,931 | 12/1987 | Bellay et al. | 371/22.3 |
| 4,815,041 | 3/1989 | Baylock | 307/481 |
| 4,819,166 | 4/1989 | Si et al. | 371/22.3 |
| 4,827,476 | 5/1989 | Gacia | 371/22.3 |
| 4,918,650 | 4/1990 | DeWolf | 395/425 |
| 4,977,537 | 12/1990 | Dias et al. | 395/425 |
| 4,984,216 | 1/1991 | Toda et al. | 365/230.08 |
| 5,003,465 | 3/1991 | Chisholm et al. | 395/275 |
| 5,033,027 | 7/1991 | Amin | 365/222 |
| 5,038,282 | 8/1991 | Gilbert et al. | 395/200 |
| 5,173,904 | 12/1992 | Daniels et al. | 371/22.3 |

Primary Examiner—Thomas C. Lee
Assistant Examiner—John C. Loomis
Attorney, Agent, or Firm—Arnold, White & Durkee

[57] ABSTRACT

Methods and apparatus for immunizing dynamic random access memory (DRAM) modules in the data processing system against data loss from transitions that occur with memory mode switching during the scan operation and permitting normal operations to be performed on the memory modules regardless of the state of the system clocks.

27 Claims, 6 Drawing Sheets

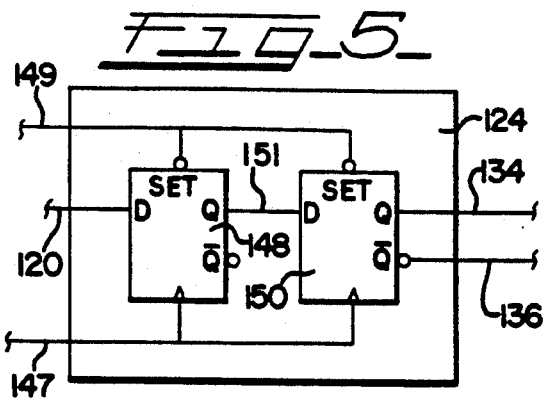
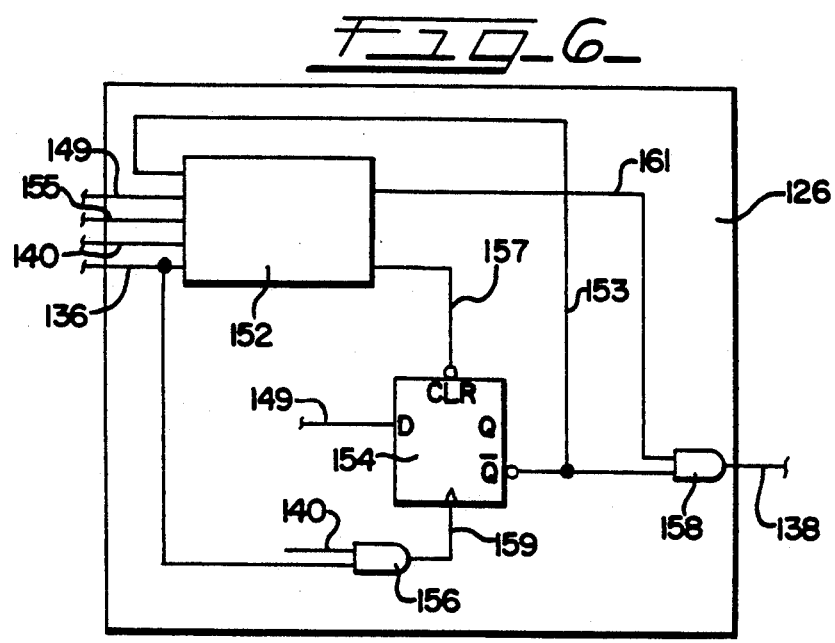
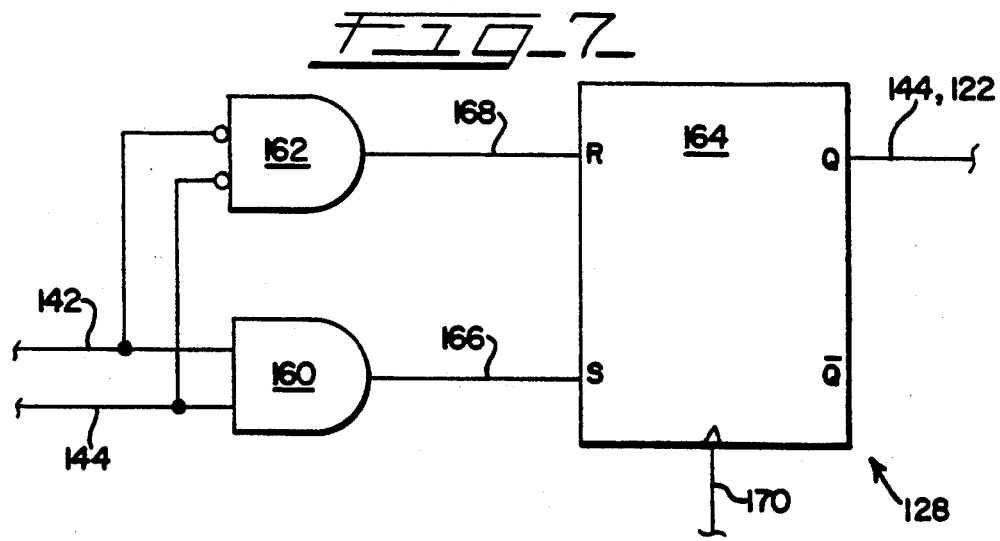

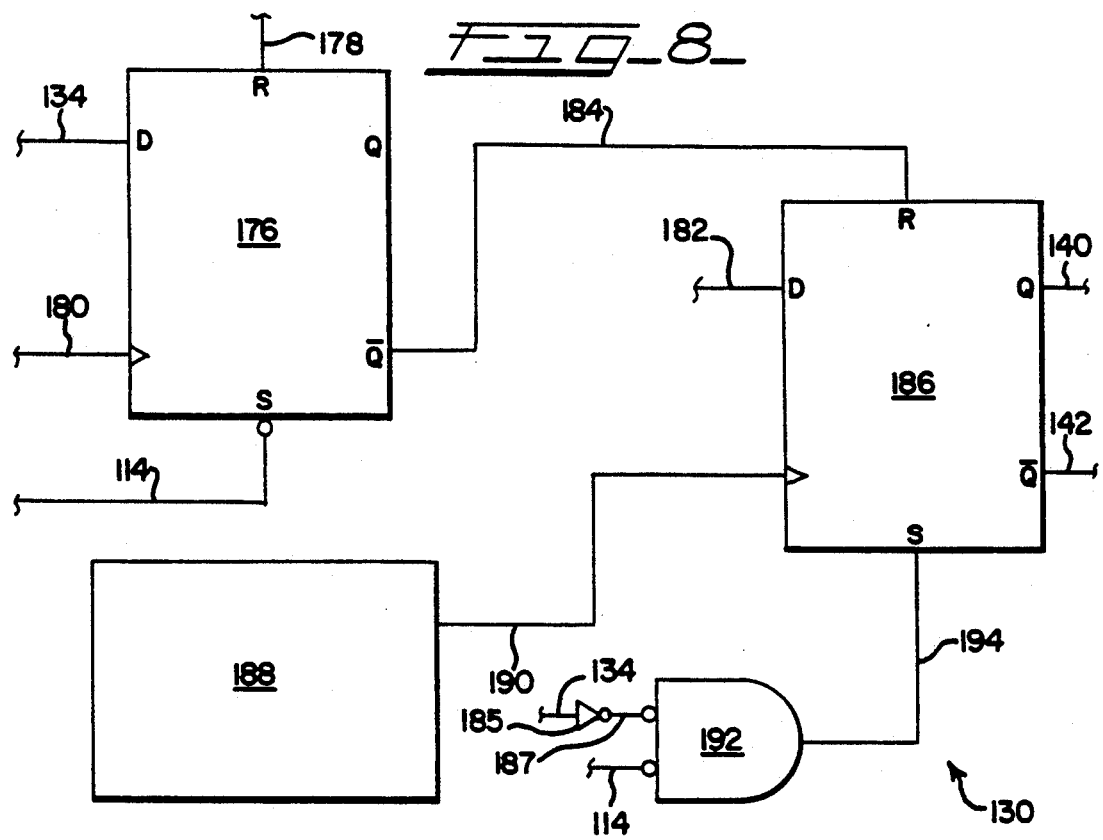
FIG_8_
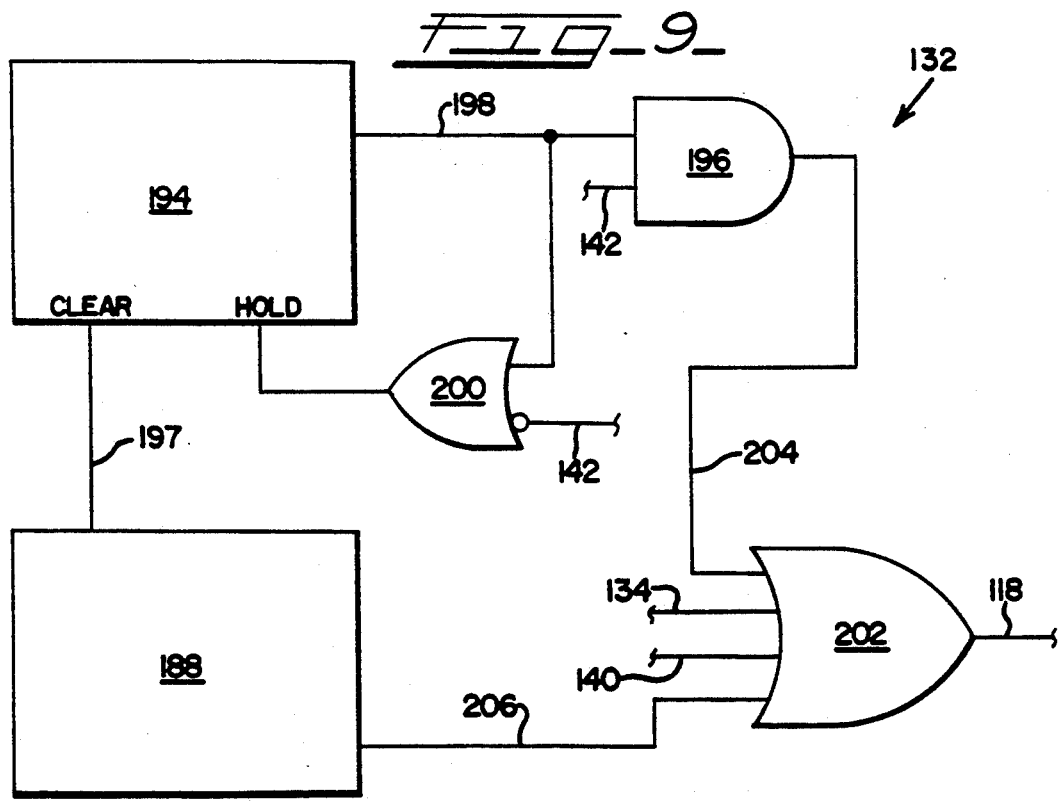
FIG_9_

METHOD AND APPARTUS FOR PERFORMING DIAGNOSIS SCANNING OF A MEMORY UNIT REGARDLESS OF THE STATE OF THE SYSTEM CLOCK AND WITHOUT AFFECTING THE STORE DATA

FIELD OF THE INVENTION

The present invention relates to diagnostic systems of the scanning type for data processing systems, and more particularly to methods and apparatus for testing the memory controller of the data processing system while immunizing dynamic random access memory (DRAM) modules in the memory system against data corruption from transitions that occur with DRAM control signals during the scan operation and permitting normal operations to be performed on the memory system regardless of the state of the system clocks.

BACKGROUND OF THE INVENTION

Regardless of size, most digital data processing systems consist of a combinational logic network and bi-stable latch elements. The combinational logic network contains hundreds or even thousands of logic gates, such as AND and OR gates, that perform the required decision-making functions. The latches surround the combinational logic and serve as memory elements to temporarily store the input data, output data and control information.

The state of the processing system is defined by the state of all of its latches. Usually, the state of the system changes at the occurrence of each clock pulse from the clocking system. The state of the system is determined by the state of the input latches, the state of the control latches, the state of the output latches and the structure of the combinational logic network at the occurrence of each clock pulse.

A data processing system may be designed with a scan technique to provide better fault isolation so that faults in the latches are independently ascertainable from faults in the associated combinational logic. In this case, the latches are modified to function like parallel-load, serial-shift registers connected end to end. This allows reconfiguring of the latches into one extensive serial shift register for test purposes.

When so configured, a select signal is used to shift the latches to a scan mode for testing from a non-scan mode. When the latches are in the scan mode, the latches are provided with a test input signal with a serial data test pattern. The last of the latches in the serial test configuration has a test output signal representative of the serial data test pattern passing through the latches in the scan mode.

A serious problem with the implementation of the scan technique is the corruption of data stored in the DRAM's of the memory modules in the memory system when the scanning mode is initiated. This is because the latches associated with control of the DRAM's are run through an arbitrary number of transitions during scan, and their outputs can corrupt the stored data in the DRAM's if the DRAM's are not isolated from these latches during scan.

Furthermore, because of the necessity to refresh the DRAM's periodically to preserve their contents, a clock must be used to control the refresh cycles. It is desirable to single step the memory controller, or run it in bursts, during scanning operations. However, if the data processing system clock is used for this purpose, it cannot be stopped, single stepped or run in bursts of cycles without interrupting the DRAM refresh cycles.

Consequently, the scanning operation cannot be conducted on a single step basis to first scan in a test pattern, single step to system clock, and then scan out the result without interrupting the DRAM refresh cycles, if the refresh cycles are timed by the system clock. This is because the memory controller is synchronized with the system clock, and it expects an uninterrupted flow of clock pulses when controlling the DRAM's. If the system clock is single stepped, this involves stopping the system clock, and the long intervals possible between clock pulses translate to large interruptions in the timing of the control signals to the DRAM's resulting in an improperly executed refresh cycle.

Similarly, it is often desirable to run a sequence of single steps, the first of which is scanned in, then a burst of clock pulses comprising the desired number of clock cycles is applied and then the result is scanned out. As in the single step case, the memory controller expects an uninterrupted flow of clock pulses, so if the burst is not long enough, then again an improperly executed refresh cycle occurs.

Because it is important that the memory controller be synchronized to the system clock during normal operation, it is not possible to simply run the memory controller on its own asynchronous clock all the time to alleviate the DRAM refresh cycle problem.

In addition to refreshing the DRAM's, it may also be desired, while single stepping or bursting the system clocks, to perform normal operations such as write and read operations to the DRAM's. Since control of these normal operations also requires an uninterrupted flow of system clock pulses, similar problems arise as described above.

SUMMARY OF THE INVENTION

The present invention overcomes the difficulties involved with preservation of data in the memory system during the scanning operation by providing a method and apparatus for switching a dynamic memory system between two modes to insure that the DRAM's in the memory system are periodically refreshed at all times. Incidentally, the present invention preserves data during power loss conditions in a similar fashion.

Specifically, these modes are the step mode and the standby mode. When the memory system is in either the step or standby modes, it runs on its own clock, that runs asynchronously with the system clock, so that the DRAM's can be periodically refreshed regardless of whether the system clock is stopped, single-stepped, or run in bursts.

The step mode also allows the memory system to accept normal operations from the memory controller. This is because the present invention provides a DRAM controller in the memory system. Once loaded with the operation desired by the memory controller, the DRAM controller executes the command with timing providing by a memory system clock that runs asynchronously with the system clock. This clock may or may not be the same clock used in the standby mode. In addition to performing normal operations to the DRAM's, the step mode DRAM controller also generates the DRAM control signal needed to properly execute the refresh cycle while in the step mode.

The standby mode allows the scanning operation to occur by isolating the memory control signals from the DRAM's. A DRAM refresh controller which provides the necessary DRAM control signals using the memory system clock that runs asynchronously with the system clock. In this way, the desired test pattern or sequence of operations is scanned in while the memory system is in the standby mode.

The present invention may be used as a diagnostic tool should a failure be recognized in the data processing system. For example, the following series of operations may be used to locate a fault. The memory system is first placed into the standby mode to allow the scanning operation to place the system into a known good state ahead of where the fault has occurred.

The data processing system then places the memory system into the step mode to permit the system clock to advance the state of the data processing system by either a single step or a burst of steps. Once this has been completed, the data processing system places the memory system back into the standby mode after which the scanning operation is conducted. The result of the scanning operation is then compared with the expected state of the data processing system to determine if the fault has been found or if further iterations of the procedure described above are required.

It is necessary to properly sequence the service processor unit (SPU), the memory controller and the memory system in the data processing system to ensure that the memory system is in the step or standby modes at the proper times. To this end, a special set of handshake signals are sent between the SPU, the memory controller and the memory system to ensure that the memory system is in the proper mode at all times.

With the step mode and standby mode used as described above, normal operations may be conducted by the memory controller either on a single step basis or through a burst of sequences without compromising the DRAM's in the memory system. Furthermore, the step and standby modes facilitate the transfer of the memory system to standby mode after AC power loss without loss of data as a result of the proper sequencing of these special handshake signals.

DESCRIPTION OF THE DRAWINGS

FIG. 5 is a schematic diagram of the standby to DCA synchronizer logic circuit for the memory module array.

FIG. 6 is a schematic diagram of the standby busy logic circuit for the memory module array.

FIG. 7 is a schematic diagram of the step control OK logic circuit for the memory module array.

FIG. 8 is a schematic diagram of the step control OK and standby enable logic circuit for the memory module array.

FIG. 9 is a schematic diagram of the step cycle busy logic circuit for the memory module array.

DESCRIPTION OF THE PREFERRED EMBODIMENT

Figure 1:
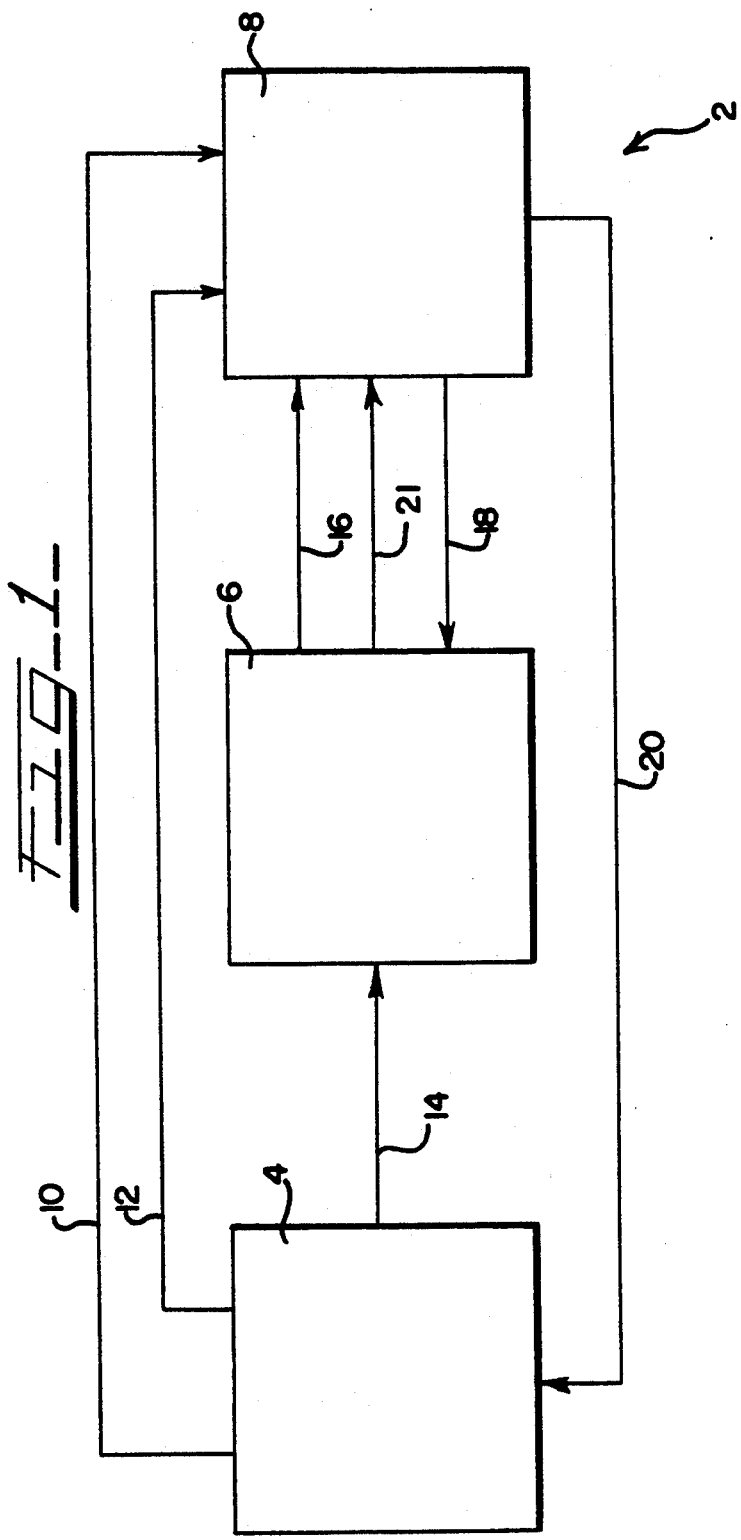
FIG. 1 is a block diagram of a data processing system configuration suitable for incorporating the present invention.

Referring to the drawings, wherein the reference characters designate like or corresponding parts throughout the views, FIG. 1 shows the general configuration of a data processing system 2 comprising a service processor unit (SPU) or console 4, an array control unit (ACU) or memory controller 6 and an array of memory modules 8 associated with the memory controller 6.

The memory module array 8 typically comprises four or eight modules, but the number of modules in the array 8 varies according to design considerations as known in the art. Likewise, although only one of the memory controllers 6 is shown with one of the memory module arrays 8, typically the processing system 2 will comprise a plurality of the memory controllers 6, each memory controller 6 having an associated one of a plurality of the memory module arrays 8. The number of memory controllers 6 and memory module arrays 8 is determined by design considerations as known in the art.

According to the present invention, the processing system 2 has three modes that are implemented to preserve the processed data during scanning and power up/power down sequences that involve stopping, stepping or bursting the system clock. These modes comprise the standby, the step and the normal modes.

The normal mode is used for all ordinary data processing operations that do not involve the interruption of the system clock to the memory controller 6. In this mode, the memory array 8 must remain synchronized to the system clock, and the system clock cannot be interrupted if the DRAM's in the memory array 8 are to be properly refreshed.

The standby mode is used to protect the DRAM's in the memory array 8 during any scanning operations. In this mode, the memory array 8 is made insensitive to the system clock, and the periodic refreshment of the DRAM's is timed according to a separate clock on board the memory array 8 for this purpose. Because this mode is insensitive to the master clock, and not in synchronization with the memory controller 6, it is unresponsive to commands from the memory controller 6 and cannot be used to execute any operations that have been scanned in.

The step mode allows the system clock to be stopped, single-stepped, or burst during ordinary data processing operations. In this mode, the memory controller 6 can perform normal operations one step at a time, or in a short sequence of steps, by controlling the system clock signal. While in the step mode, the memory array 8 uses its on board clock so that stopping, stepping or bursting of the system clock does not adversely affect the refresh cycle for the DRAM's in the memory array 8.

In this way, the operations that are scanned in during the standby mode may be executed in the step mode one step at a time, or in a short sequence of steps. Thus, for performing single step or short sequence scanning operations, the entire scanning process involves shuttling between the standby mode to scan in a normal operation or sequence of operations, transferring to the step mode to execute the operations, and transferring back to the standby mode to scan out the result.

In the discussion of the preferred embodiment of the invention below, the mode switching order is described with specific constraints to insure data integrity in the DRAM's used in the memory modules of the array 8. Although this order is preferred for the described implementation, the present invention can be adapted to another order of mode switching or mode switching with a different number of modes, according to design requirements.

In the preferred embodiment there are four mode switching operations that are made to implement the present invention. These mode switching operations are standby to step, step to standby, step to normal and normal to step. From system power on to normal system operation the mode switching order is standby to step followed by step to normal. From normal system operation to standby, such as required for battery backup during power loss or during scanning, the mode switching order is normal to step followed by step to standby.

From normal system operation to an operation that allows the system clocks to stop the mode switching order is normal to step. The mode switching order from an operation that allows system clocks to stop to normal system operation is step to normal.

The memory unit 8 receives DRAM control signals for execution of its DRAM's operations from the memory controller 6 via a line 21. For proper execution of these operations when the memory array 8 is in the normal mode, the memory controller 6 must be synchronized to the system clock.

As part of the present invention, the DRAM control signals are still received by the memory unit 8 from the memory controller 6, but in the step mode the memory array 8 stores these DRAM control signals and then executes them with its own clock. To implement this operation, the operation of the memory array 8 is altered under control of the special handshake signals according to the present invention.

The first of these handshake signals is a step mode enable signal that is transmitted from the memory controller 6 to the memory array 8 on a line 16. The step mode enable signal is asserted to indicate to the memory array 8 that the memory controller 6 wants the memory array 8 to go into the step mode.

The second of these handshake signals is a step mode request signal that is transmitted from the console 4 to the memory controller 6 on a line 14. This signal is asserted to communicate to the memory controller 6 that it should enable the memory array 8 to switch into the step mode.

The third of these handshake signals is a step mode acknowledgment signal that is transmitted from the memory unit 8 to the console 4 on a line 20. This signal is asserted to communicate to the console 4 that the memory array 8 has switched over to the step mode.

The fourth of these handshake signals is a step mode busy signal that is transmitted from the memory array 8 to the memory controller 6 on a line 18. This signal is asserted to communicate to the memory controller 6 that the memory array 8 either cannot accept commands in the step mode or is busy performing a previously accepted command. This signal is also asserted when the memory array 8 is in transition to the step mode, when it is in the standby mode and also when it is in transition to the normal mode.

The fifth of these handshake signals is a standby mode enable signal that is transmitted from the console 4 to the memory array 8 on a line 10. This signal is asserted to communicate to the memory array 8 that the memory array 8 should switch to the standby mode.

The standby control enable signal serves to isolate the DRAM's from the DRAM control signals from the memory controller 6 while the memory array 8 is in the standby mode. In this way, data can be scanned into and out of the memory controller 6 without affecting the states of the DRAM's in the memory array 8. During standby mode the DRAM's in the memory array 8 are periodically refreshed using the clock in the memory unit 8.

The sixth of these handshake signals is a system initialization signal that is transmitted from the console 4 to the memory unit 8 on a line 12. This signal is asserted while the memory array 8 is in the standby mode, and is used to initialize the step mode DRAM controller in preparation for transitions from the standby mode the step mode when desired.

The step mode acknowledgment signal is deasserted by the memory array 8 to communicate to the console 4 that the memory array 8 is or is not in the standby mode, respectively. and the step mode busy signal is asserted by the memory array 8 to communicate to the memory controller 6 that the memory array 8 cannot accept commands in the step mode, even though the step control enable signal has been asserted by the memory controller 6.

Figure 4:
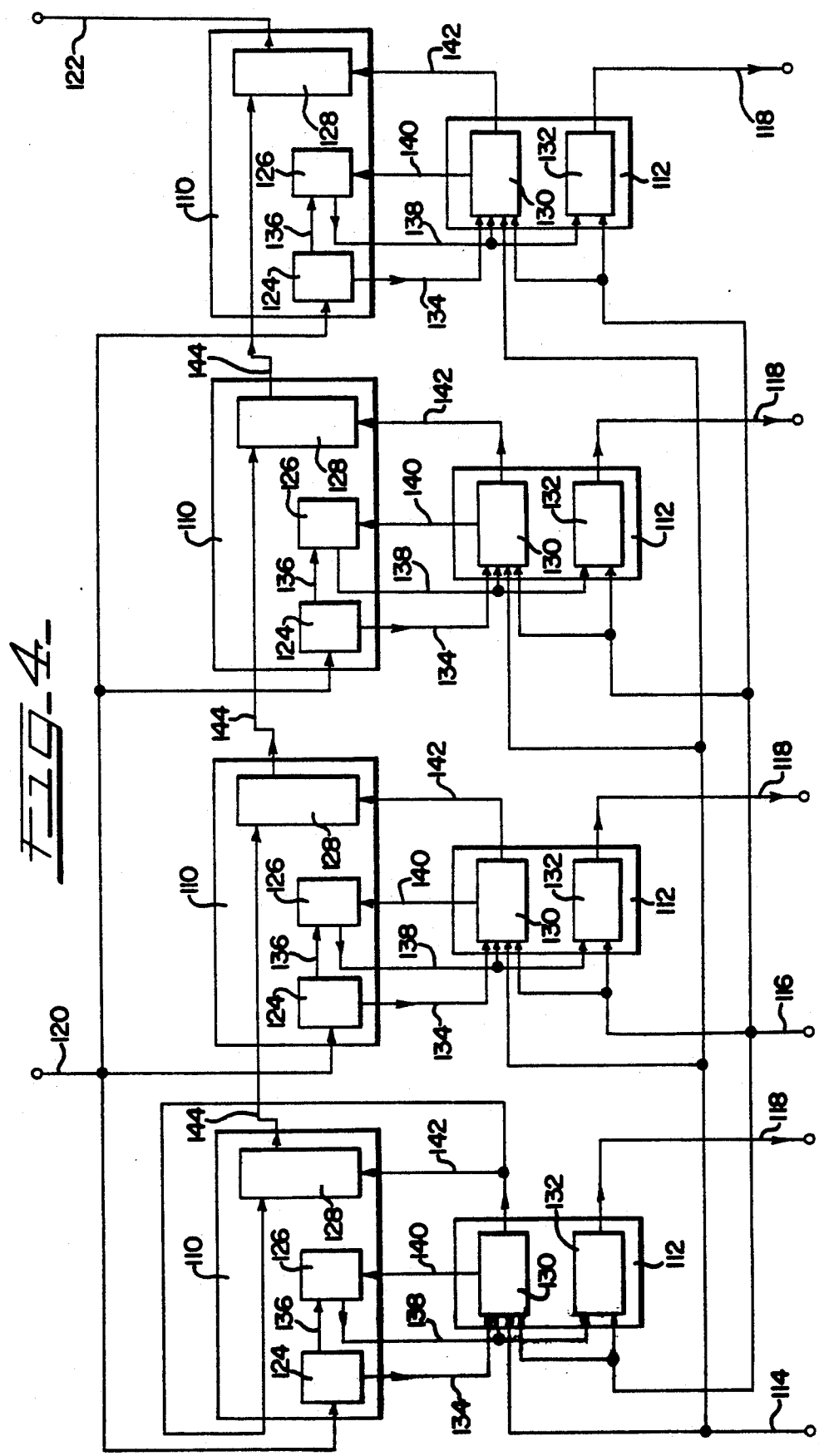
FIG. 4 is a block diagram of the mode switching circuitry for the four memory module array in the processing system shown in FIG. 1.

A functional block diagram of the mode switching circuitry for a four memory module implementation of the memory module array 8 is shown in FIG. 4. The mode switching circuitry is divided into a Miscellaneous Logic (MISC) section 110 and a DRAM Control Array (DCA) section 112 for each of the four memory modules (not shown) in the array 8.

Each of the DCA's 112 receives DRAM control signals for the DRAM's that it controls from the memory controller 6. In normal operation, each of the DCA's 112 process the DRAM control signals for their corresponding DRAM's. The DCA's 112 also control the refresh cycles of their respective DRAM's while in the step mode using their own clocks that run asynchronously with the system clock. Also in the step mode, each of the DCA's 112 store the DRAM control signals and apply these signals to the respective DRAM's again using its own clock for proper DRAM cycle timing.

In the standby mode, the DCA's 112 are non-responsive to the DRAM control signals from the memory controller 6. In this mode, the DCA's 112 are completely inactivated and the control of refresh cycles for the DRAM's are transferred to each one of the corresponding MISC's 110. The MISC's 110 control the refresh cycles of their respective DRAM's utilizing their own respective on-board clocks.

Each of the MISC's 110 comprise a standby to DCA synchronizer circuit 124 that has an input for the standby mode enable signal on the line 120. The standby to DCA synchronizer circuit 124 senses the level of the standby mode enable signal and transmits a sync standby mode enable signal of similar level on an output line 134 that is synchronized with the respective on-board clock. It should be noted that if the CDA 112 and the MISC 110 use different on-board clocks, than another level of synchronization is needed at the input of the DCA 112.

The synchronizer circuit 124 also has a complementary sync standby mode enable signal on an output line 136. A simple implementation of the synchronizer circuit 124 is shown in FIG. 5. It comprises a first D-type flip-flop 148 and a second D-type flip-flop 150.

The D input of the first flip-flop 148 receives the standby mode enable signal on the line 120. The non-inverted Q output of the first flip-flop 148 is fed to the D input of the second flip-flop 150 on a line 151. The sync standby mode enable signal is fed from the non-inverted Q output of the second flip-flop 150 on the line 134. The complementary sync standby mode enable signal is fed from the inverted Q output of the second flip-flop 150 on the line 136.

The clock inputs of the first flip-flop 148 and the second flip-flop 150 receive an on-board clock signal on a line 147. The set inputs of the first flip-flop 148 and the second flip-flop 150 receive a battery back-up acknowledgment signal on a line 149 that, when deasserted, that is, in the low state, forces the synchronizer 124 to generate an asserted sync standby mode enable signal. When the battery back-up acknowledgment signal on the line 149 becomes asserted, the forced set on the flip-flops 148 and 150 is removed and the synchronizer circuit 124 is allowed to operate normally. This in effect initializes the synchronizer 124 to generate sync standby mode enable signals as the data processing system 2 is powering up.

Each of the MISC's 110 also comprises a standby busy logic circuit 126 that has an input for the complementary sync standby mode enable signal on the line 136 and an input for a DCA standby mode enable signal on a line 140. The standby busy logic circuit 126 senses the levels of the complementary sync standby mode enable signal on the line 136 and the DCA standby mode enable signal on the line 140 and generates a standby mode busy signal on an output line 138. The level of the standby mode busy signal on the line 138 indicates to the DCA 112 that the corresponding memory module in the memory array 8 is either not ready to enter the step mode because the standby mode DRAM controller is busy refreshing the DRAM's or it is ready to enter step mode.

A simple implementation of the standby busy logic circuit 126 is shown in FIG. 6. A standby sequencer state machine 152 senses the levels of the complementary sync standby mode enable signal on the line 136, the DCA standby mode enable signal on the line 140, the battery back-up acknowledgment signal on the line 149, a start standby mode signal on a line 153 and a DRAM refresh request acknowledgment signal on a line 155.

The state machine 152 asserts a clear refresh signal on an output line 157. The clear refresh signal is asserted to indicate that a refresh cycle is completed. The state machine 152 also asserts a standby select signal on a line 161 to indicate that the standby circuitry is busy. Note that the asserted level of this signal is low.

The standby busy logic circuit 126 also comprises a D-type flip-flop 154 and a first AND gate 156. A logic high signal is fed to the D input of the flip-flop 154 whenever the battery back up acknowledgment signals on the line 149 is asserted level high. The clear refresh signal on the line 157 is fed to the reset input of the flip-flop 154 to reset the flip-flop 154 whenever the clear refresh signal is asserted.

The output of the first AND gate 156 is fed to the clock input of the flip-flop 154 on a line 159. One input of the first AND gate 156 receives the complementary sync standby mode enable signal on the line 136 and the other input of the first AND gate 156 receives the DCA standby mode enable signal on the line 140. The output of the first AND gate 156 is thereby asserted whenever the complementary sync standby mode enable signal and the DCA standby mode enable signal are both asserted.

The standby busy logic circuit 126 also comprises a second AND gate 158. One input of the second AND gate 158 receives the standby select signal on the line 161. The other input of the second AND gate 158 receives the start standby signal on the line 153. The output of the second AND gate 158 is the standby mode busy signal on the line 138.

In the preferred embodiment described above, the data processing system 2 powers up such that the battery back-up acknowledgment signal on the line 149 becomes asserted high first. This makes the D input of the flip-flop 154 high. In time, the next thing that occurs is that the complimentary sync standby mode enable signal becomes asserted high. This is followed by the high level assertion of the DCA standby mode enable signal on the line 140. When this occurs, the output of the AND gate 156 on the line 159 transitions from low to high. This edge, when applied to the edge sensitive clock input of the flip-flop 154, causes the flip-flop 154 to become set due to the high state of the D input. Note that the clear refresh signal on line 157 to the flip-flop 154 is deasserted because a refresh has not yet occurred.

The action of setting the flip-flop 154 causes the start standby signal on the line 153 to be asserted low. This in turn causes the output of the AND gate 158 to go low and therefore the standby mode busy signal on the line 138 becomes low, which is its asserted state.

The assertion of the standby mode busy signal completes the handshake loop between the standby busy logic circuit 126 and the DCA 112. By that, it is meant that now both of these circuits acknowledge the standby mode.

The assertion of the start standby signal on the line 153 is also felt by the state machine 152. When the state machine 152 receives the DRAM refresh request acknowledgment signal on the line 155 it starts its first DRAM refresh cycle. Upon entering into the DRAM cycle, the standby select signal on the line 161 becomes asserted low. Note that the application of the asserted low standby select signal to the input of the AND gate 158 does not change its output because the output is already low due to the low assertion of the start standby signal on the line 153 on the other input.

When the DRAM refresh cycle is completed, the state machine 152 asserts the clear refresh signal on the line 157. The low assertion on the clear input of the flip-flop 154 causes the outputs of the flip-flop 154 to toggle and thus the start standby signal on the line 153 to become deasserted high. Note that the disassertion of the start standby signal does not cause the output of the AND gate 158 to change from its low level because the other input, the standby select signal on the line 161, is keeping its output low. Therefore, the standby mode busy signal on the line 138 remains asserted low.

In time, the data processing system 2 will transition from the standby mode to the step mode. At that time, the complementary sync standby mode enable signal on the line 136 will become deasserted, followed some amount time later by the deassertion of the DCA standby mode enable signal on the line 140.

When this occurs, and immediately following the next DRAM refresh cycle, the state machine 152 deasserts the standby select signal on the line 161. This, in turn, causes the output of the AND gate 158 to become high and consequently the deassertion of the standby mode busy signal on the line 138. At this time, the handshake loop is complete between the DCA 112 and the standby busy logic circuit 126, whereby both acknowledge step mode.

At some time, the data processing system 2 will decide to transition from step mode to standby mode. The initial sequence of events as discussed above will happen again, in that the two input signals on the AND gate 156 will become high asserted, thus causing the setting of the flip-flop 154.

Each of the MISC's 110 also comprise a step control OK logic circuit 128 that has an input for a step mode control OK signal and an input for a DCA step control acknowledgment signal on a line 142. One of the MISC's 110 receives its step mode control OK signal input from its corresponding DCA step control acknowledgment signal on the line 142. The other MISC's 110 receive their stepmode control OK signal input on a line 144 that is not from a corresponding DCA step control acknowledgment signal on the line 142, but from another MISC 110, for reasons described below.

The circuits 128 for each of the MISC's 110 are connected together in a "daisy chain" configuration. The reason for doing this is to insure that the step mode acknowledgment signal on the line 122 is neither asserted nor deasserted until all of the memory modules of the memory array 8 are in agreement as to the proper output level. It can be seen in FIG. 4 that the daisy chain starts with the MISC 110 on the left and ends with the MISC 110 on the right.

At the start of the daisy chain, since the MISC 110 has no previously MISC 110 to get input from, it observes only its own situation when determining what its output to the next MISC 110 in the daisy chain should be. It does this by using the level of the DCA step control acknowledgment signal on the line 142 as its only criterion for determining the level of its output signal, the step mode control OK signal on the line 144.

The MISC's 110 between the start and the end of the daisy chain determine the level of their step mode control OK signal on the line 144 by examining their corresponding DCA step control acknowledgment signal on the line 142 and the step mode control OK signal on the line 144 from the preceding MISC 110 in the daisy chain.

The last MISC 110 in the daisy chain examines signals similar to the previous stages, but unlike the others, its output becomes the step mode acknowledgment signal on the line 122 that goes back to the console 4. In summary, the step mode acknowledgment signal on the line 122 to the console 4 is not asserted until all of the modules of the memory array 8 are in step mode and is not deasserted until all of the modules of the memory array 8 are out of the step mode.

A simple implementation of the step control OK logic circuit 128 is shown in FIG. 7. The DCA step mode acknowledgment signal on the one of the lines 142 from the corresponding DCA 112 is fed to a first input of a first AND gate 160 and a first inverted input of a second AND gate 162. The step mode control OK signal on the one of the lines 144, from the previous one of the circuits 128 in the daisy chain, or from the DCA step mode acknowledgment signal, depending on its position in the daisy chain, is fed to a second input of the first AND gate 160 and a second inverted input of the second AND gate 162.

The first circuit 128 in the daisy chain has the DCA step mode acknowledgment signal on the one of the lines 142 for the corresponding DCA 112 fed to both inputs of the first AND gate 160 and both inverted inputs of the second AND gate 162. The output of the first AND gate 160 is fed to the S (set) input of a R-S (reset-set) type flip-flop 164 on an output line 166. The output of the second AND gate 162 is fed to the R (reset) input of the R-S flip-flop 164 on a line 168.

The on-board clock signal for the memory module corresponding to the circuit 128 is fed to the clock input of the R-S flip-flop 164 on a line 170. The Q (noninverted) output of the R-S flip-flop 164 is the step mode control OK signal on the line 144 or the step mode acknowledgment signal on the line 122, depending on its position in the daisy chain.

Consequently, when the DCA step mode acknowledgment signal fed to the first circuit 128 in the daisy chain is asserted high on the lines 142 and 144 from its associated one of the DCA's 112, the first AND gate 160 asserts its output on the line 166 to set the R-S flip-flop 164 on the next pulse from the memory module clock. This causes the step mode control OK signal from the Q output of the R-S flip-flop 164 to be asserted on the line 144 that is coupled to the next circuit 128 in the daisy chain.

However, if the DCA step mode acknowledgment signal to the first circuit 128 is deasserted, the second AND gate 162 asserts its output on the line 168 to reset the R-S flip-flop 164 on the next memory module clock pulse. This deasserts the step mode control OK signal from the Q output of the R-S flip-flop 164 on the line 144 that is coupled to the next circuit 128 in the daisy chain.

Since the same signals appear on the inputs of both the first AND gate 160 and the second AND gate 162 the potential for a race condition to the flip-flop 164 exists. This condition can be alleviated by insuring that the input signals are allowed to change only at times between when the clock pulses reach the flip-flop 164 utilizing methods well known in the art.

In a similar fashion, each one of the rest of the circuits 128 that are in the daisy chain assert the Q output of their respective R-S flip-flop 164 when both the DCA step mode acknowledgment signal on the line 142 from its respective one of the DCA's 112 and the step mode control OK signal on the one of the lines 144 from the preceding circuit 128 in the daisy chain are both asserted.

Likewise, each one of the rest of the circuits 128 that are in the daisy chain deassert the Q output of their respective R-S flip-flop 164 when both the DCA step mode acknowledgment signal on the line 142 from its respective one of the DCA's 112 and the step mode control OK signal on the one of the lines 144 from the preceding circuit 128 in the daisy chain are both deasserted.

The output of the R-S flip-flop 164 for the last circuit 128 in the daisy chain is the step mode acknowledgment signal on the line 122. It is asserted only when the DCA step mode acknowledgment signal from the one of the DCA's 112 corresponding to each one of the circuits 128 is asserted and the step mode control OK signal from each preceding one of the circuits 128 in the daisy chain is asserted.

Likewise, the output of the R-S flip-flop 164 for the last circuit 128 in the daisy chain, the step mode acknowledgment signal on the line 122, is deasserted only when the DCA step mode acknowledgment signal from the one of the DCA's 112 corresponding to each one of the circuits 128 is deasserted and the step mode control OK signal from each preceding one of the circuits 128 in the daisy chain is deasserted.

Each of the step control busy logic circuits 130 for each of the DCA's 112 has four inputs, as shown in FIG. 4. A first input receives the system initialization signal on one of the lines 114. A second input receives the step mode enable signal on the line 116. A third input receives the sync standby mode enable signal on one of the lines 134. A fourth input receives the standby mode busy signal on one of the lines 138.

Each of the circuits 130 has two output signals. The first output signal is the DCA standby mode enable signal on one of the lines 140 that is received by an associated one of the circuits 126 as described above. The second output signal is the DCA step mode acknowledgment signal on one of the lines 142 that is received by the circuit 128 as described above.

Each of the step cycle busy logic circuits 132 has two inputs. One of the inputs receives the step mode enable signal on the line 116. The other input receives the standby mode busy signal on the line 138 from an associated one of the circuits 126 as described above. Each of the circuits 132 has an output providing the step mode busy signal on the line 118.

To initiate the step mode from the normal mode, the step mode enable signal on the line 116 is asserted by the memory controller 6. Each of the DCA's 112 starts its associated DRAM controller (not shown) in preparation for entering the step mode. As stated above, and described in detail below, the step cycle busy logic circuit 132 of each DCA 112 asserts it associated step mode bus signal on the line 118 which informs the memory controller 6 that the particular memory module of the memory array 8 is not yet able to accept step mode operations. The memory array 8 has switched to the step mode when the step mode acknowledgment signal on the line 122 is asserted as described above. The array 8 switches to the step mode as the step mode acknowledgment signal on the line 122 is asserted.

As explained above, the standby mode is initiated as a part of the power up/down and scanning operations. After power up, the standby mode can be entered only after the memory array 8 has switched into the step mode. When the memory array 8 is in the step mode, the console 4 requests the standby mode by asserting the standby mode enable signal on the line 120.

The circuit 124 of each of the MISC's 110 then asserts the sync standby mode enable signal on one of the lines 134 and sends it to the associated one of the DCA's 112. The circuit 130 of the DCA's 112 then asserts the DCA standby enable signal on one of the lines 140. The assertion of these two signals causes the circuit 126 in each of the MISC's 110 to assert the standby mode busy signal on one of the lines 138 and put the memory array 8 ready to go into the standby mode.

The memory array 8 switches to the standby mode only after any DRAM cycle in progress is completed. The DCA step mode acknowledgment signal on one of the lines 142 is then deasserted by the step control busy circuit 130 in each of the DCA's 112 and the step mode busy signal on the line 118 is asserted by the step cycle busy circuit 132 in each of the DCA's 112 to switch the memory array 8 to the standby mode.

During scan operation or during system power loss the memory module array 8 is put into standby mode. Standby operation keeps refreshes going to the DRAM's to insure that the contents of the memory module array 8 are not compromised. When power is restored the memory array 8 remains in standby mode until after the initialization by the console 4.

In order for the memory array 8 to switch to the step mode from the standby mode, the memory controller 6 keeps the step mode enable signal on the line 116 asserted and the console 4 deasserts the standby mode enable signal on the line 120. The circuit 124 in each of the MISC's 110 then deassert the sync standby mode enable signal on one of the lines 134.

The circuit 130 in each of the DCA's 112 then deasserts the signal DCA standby mode enable signal on one of the lines 140 to request the end of the standby operation. As soon as the standby mode DRAM control has completed with the current refresh cycle, the standby mode busy signal is deasserted by the circuit 126 in each of the MISC's 110 to indicate that the array 8 is ready to switch to the step mode.

The circuit 130 in each of the DCA's 112 then asserts the DCA step mode acknowledgment signal. The step mode acknowledgment signal is asserted on the line 122 to indicate that the memory array 8 has switched to the step mode when the inputs of the circuit 128 for each of the MISC's 110 receive asserted signals.

In order to switch the memory array 8 from the step mode to the normal mode, the memory controller 6 deasserts the step mode enable signal on the line 116. The DCA's 112 of the memory array 8 will then exit the step mode only after any memory cycle in progress is completed. Otherwise, they will continue to assert the step mode busy signal on the line 118.

After the current memory cycle is completed, the step mode busy signal on the line 118 is deasserted by the DCA's 112. The DCA's 112 also deassert the DCA step mode acknowledgment signal and the MISC's 110 deassert the step mode acknowledgment signal on the line 122 as the memory array 8 switches to the normal mode.

A simple implementation of the step control OK and step control busy logic circuit 130 is shown in FIG. 8. The sync standby mode enable signal from the associated one of the MISC's 110 is fed to the D (data) input of a first D-type flip-flop 176 on the line 134. The first D-type flip-flop receives the system initialization signal on its inverted set input from the line 114, a logic zero via a line 178 on its reset input and the clock signal for the corresponding memory module on the on-board clock input via a line 180.

The inverted output of the first D-type flip-flop 176 is fed to the reset input of a second D-type flip-flop 18 via a line 184. A logic one is fed to the D input of the second D-type flip-flop 186 via a line 182. A step mode switching sequencer state machine 188 provides a sequencer standby enable signal for the clock input of the second D-type flip-flop 186 via a line 190.

The sync standby mode enable signal on the line 187 is fed to an inverter 185. The output of the inverter 185 is fed to the first inverted input of an AND gate 192 via a line 187. The system initialization enable signal on the line 114 is fed to the second inverted input of the AND gate 192. The output of the AND gate 192 is fed to the set input of the second D-type flip-flop 186 via a line 194. The non-inverted output of the second D-type flip-flop 186 is the DCA standby mode enable signal on the line 140. The inverted output of the second D-type flip-flop 186 is the DCA step mode acknowledgment signal on the line 142.

Shortly after the data processing system 2 is powered on, the sync standby mode enable signal becomes asserted high. This has two effects on the circuit 130. First, when the on-board clock strobes the flip-flop 176, the line 184 on the inverted output of the flip-flop 176 becomes low, thereby not holding the flip-flop 186 reset. Secondly, an inverted version of this signal supplied by the inverter 185 via the line 187 is placed on the first inverted input of the AND gate 192. At some later time, when the console 4 asserts the system initialization signal on the line 114, that is low asserted, the output of the AND gate 192 transitions from low to high which causes the flip-flop 186 to become set and therefore the DCA standby mode enable signal on the line 140 becomes asserted and the DCA step mode acknowledgment signal on the line 142 becomes deasserted.

A short time later, the console 4 will deassert the system initialization signal on the line 114 which in turn removes those on the flip-flop 186. When the console 4 decides to switch from the step mode to the standby mode, it deasserts indirectly via the MISC 110 circuitry, the sync standby mode enables signal line 134.

At the occurrence of the next on-board clock, the flip-flop 176 toggles and the inverted output line 184 becomes high thereby resulting the flip-flop 186. This causes the DCA standby mode enable signal on the line 140 to become deasserted and the DCA step mode acknowledgment signal on the line 142 to become asserted.

This completes the handshake loop between the respective MISC 110 and the DCA 112 to acknowledge the step mode. When the console 4 decides to transition from the step mode to the standby mode, it indirectly asserts the sync standby mode enable signal on the line 134 via the respective MISC 110 through its synchronization circuit 124.

When the next on-board clock signal occurs, the flip-flop 176 toggles again and the inverted output on the line 184 becomes low and removes the reset from the flip-flop 186. When all step mode operations to the DRAM's have been completed, the step mode switching sequencer state machine 188 asserts the sequencer standby enable signal to the clock input of the flip-flop 186 via the line 190. This causes the flip-flop 186 to be set due to the logic high present on the D input via the line 182.

In turn, this causes the DCA standby mode enable signal on the line 140 to be asserted and the DCA step mode acknowledgment signal on the line 142 to be deasserted. This completes the handshake loop between the respective MISC 110 and the DCA 112 acknowledging the standby mode.

A simple implementation of the step cycle busy logic circuit 132 is shown in FIG. 9. The step mode switching sequencer state machine 188 supplies a clear step mode command signal to the clear input of a step mode command buffer 194 via a line 192. The output of the step mode command buffer 194 is fed to the first input of an AND gate 196 via a line 198.

The DCA step mode acknowledgment signal on the line 142 from the respective one of the DCA's 112 is fed to the second input of the AND gate 196. The DCA step mode acknowledgment signal on the line 142 is also fed to a first inverted input of an OR gate 200. The output of the step mode command buffer 194 on the line 198 is also fed to a second input of the OR gate 200. The output of the OR gate 200 is fed to the hold input of the step mode command buffer 194.

The output of the AND gate 196 is fed to a first input of a four input OR gate 202 via a line 204. The sync standby mode enable signal on the line 134 from the respective one of the MISC's 110 is fed to a second input of the four input OR gate 202. The DCA standby mode enable signal on the line 140 from the respective circuit 130 is fed to a third input of the four input OR gate 202.

A sequencer step to normal mode switch signal from the step mode switching sequencer state machine 188 on a line 206 is fed to a fourth input of the four input OR gate 202. The output of the four input OR gate 202 is the step mode busy signal on the line 118 for the respective DCA 112.

As noted above, there are a number of instances that cause the step mode busy signal on the line 118 to become asserted. This happens whenever the respective module of the memory array 8 is in the standby mode. This can be seen in FIG. 9 by observing that asserted high levels of either the DCA standby mode enable signal on the line 140 or the sync standby mode enable signal on the line 134 cause the output of the four input OR gate 202 to become high, which is the step mode busy signal on the line 118.

Another way that the step mode busy signal can become asserted is when a memory module in the memory array 8 is transitioning from the step mode to the normal mode or from the normal mode to the step mode. Referring again to FIG. 9, the output on the line 206 of the step mode switching sequencer state machine 188 is asserted whenever these two cases arise. The high assertion of the signal on the line 206 again causes the output of the four input OR gate 202 to become high, and subsequently the step mode busy signal on the line 118.

The other instance when the step mode busy signal is asserted is when either the step mode DRAM controller is busy doing a step mode operation or is unable to accept a step mode operation command from the memory controller 6. Again referring to FIG. 9, the step mode sequencer state machine 188 causes the assertion of the clear step mode command signal to occur just prior to acknowledging the transition from the standby mode to the step mode. This action clears the step mode command buffer 194, which allows it to receive step mode operation commands from the memory controller 6.

When a step mode operation command is received, the step mode command buffer 194 high asserts the signal on the line 198. This signal is applied to one input of the OR gate 200 whose output also becomes high and holds the contents of the step mode command buffer 194, thereby disallowing no other commands to be accepted. The assertion of the signal 198 is also applied to one input of the AND gate 196. The other input of the AND gate 196 is the DCA step mode acknowledgment signal that was asserted high prior to the assertion of step mode acknowledgment signal that signals to the console 4 that the memory array 8 is in the step mode as described above.

Therefore, this input to the AND gate 196 becomes asserted prior to any step mode operation command being sent to the module. It should also be noticed that when the DCA step mode acknowledgment signal is low, or deasserted, the inverted input of the OR gate 200 causes the output to become high, thereby holding the contents of the command buffer 194. Therefore, whenever the respective module is not in the step mode, the step mode command buffer 194 is closed to the memory controller 6. Because the inputs of the AND gate 196 are both high, the output in the line 204 becomes high, causing the output of the four input OR gate 202 to also become high, and subsequently the step mode busy signal on the line 118.

Figure 2:
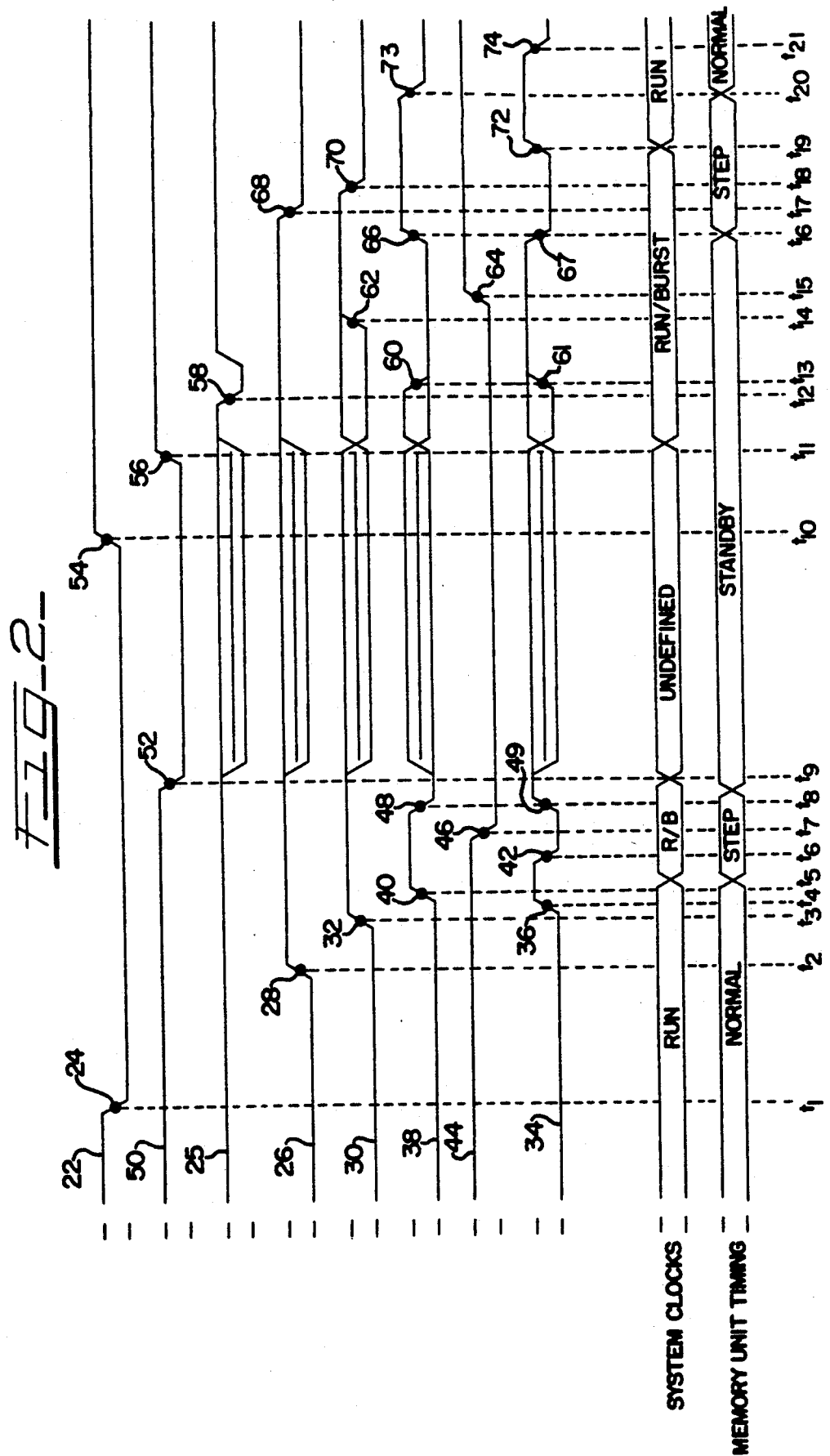
FIG. 2 is a timing diagram representing the signal levels of five of the special handshake signals between the console, the memory controller and the memory module array of the processing system shown in FIG. 1 during a complete cycle of the processing system states between the normal, step and standby modes that includes the power down/power up sequence.

FIG. 2 is a timing diagram representing the signal levels of the six special handshake signals described above between the console 4, the memory controller 6 and the memory module array 8 of the processing system 2 shown in FIG. 1 during a complete cycle of the processing system states between the normal, step and standby modes that includes the power down/power up sequence, shown starting in the normal mode. These handshake signals are necessary to provide proper sequencing between the console 4, the memory controller 6 and the memory array 8, because they may all be running from different clocks. Also shown are the AC and DC power signal levels, the associated system clock states and memory module array modes during the power down/power up sequence.

Line 22 represents the signal level of an AC power signal for the processing system 2. It deasserts from a high level representing a power on condition to a low level representing a power down condition at a first time $t_1$ during the normal mode represented by a transition point 24.

Line 25 represents the signal level of the system initialization signal transmitted from the console 4 to the memory module array 8. It remains deasserted in the normal mode.

Line 26 represents the signal level of the step mode request signal transmitted from the console 4 to the memory controller 6. The console 4 asserts this signal in response to the deassertion of the AC power signal at the time $t_1$ to order the memory controller 6 to enable the memory module array 8 to switch to the step mode after it finishes the DRAM cycle, if one is in progress. The assertion of this signal occurs at a second time $t_2$ represented by a transition point 28 after the first time $t_1$.

Line 30 represents the signal level of the step mode enable signal transmitted from the memory controller 6 to the memory module array 8. The memory controller 6 asserts this signal in response to the assertion of the step mode request signal occurring at the time $t_2$ to enable the memory module array 8 to switch to the step mode after the memory controller 6 completes any DRAM cycle, if one is in progress. The assertion of this signal occurs at a third time $t_3$ represented by a transition point 32 after the time $t_2$.

Line 34 represents the signal level of the step mode busy signal transmitted from the memory module array 8 to the memory controller 6. The array 8 asserts this signal in response to the assertion of the step mode enable signal occurring at the third time $t_3$ to indicate to the memory controller that it is switching to the step mode and cannot yet receive step mode commands. The assertion of this signal occurs at a fourth time $t_4$ represented by a transition point 36 after the time $t_3$.

Line 38 represents the signal level of the step mode acknowledgment signal transmitted from the memory module array 8 to the console 4. The array 8 asserts this signal after the entire memory module array 8 is in the step mode. The assertion of this signal occurs at a fifth time $t_5$ represented by a transition point 40 after the time $t_4$.

After the time $t_5$ the system 2 is in the step mode and the system clocks are free to be stopped, single stepped or programmed burst as desired. The step mode busy signal on the line 34 is deasserted by the memory module array 8 after the array 8 is free to accept step mode commands. This occurs at a sixth time $t_6$ represented by the transition point 42 after the time $t_5$.

Line 44 represents the signal level of the standby mode enable signal transmitted from the console 4 to the memory module array 8. This signal is asserted at a seventh time $t_7$ represented by a transition point 46 after the time $t_6$ to prepare the memory module array 8 to switch to the standby mode.

The memory module array 8 then deasserts the step mode acknowledgment signal on the line 38 to advise the console 4 that the array 8 has completed the switch to the standby mode. This occurs at an eighth time $t_8$ represented by a transition point 48 after the time $t_7$. Also at the time $t_8$, the memory module array 8 asserts the step mode busy signal, as represented by a transition point 49 on the line 34, to inform the memory controller 6 that the array 8 can no longer accept step mode commands.

Line 50 represents the signal level of a DC power signal for the processing system 2. It shifts from a high level representing power on to a low level representing power off. After the memory module array 8 has engaged the standby mode, the array 8 is immune to power loss because the battery backup is then available. Therefore, the DC power is maintained until after the time $t_8$ to allow the array 8 to engage the standby mode. Thus, system DC power is only removed at a ninth time $t_9$, represented by a transition point 52 after the time $t_8$ when the memory 8 has switched to the standby mode.

After the time $t_9$, only battery back-up power is available. Battery back up power is only suitable for keeping the DRAM's refreshed in the standby mode until the system DC power is restored.

While the DC power level signal is low, the signal levels of the system initialization signal on the line 25, the step mode request signal on the line 26, the step mode enable signal on the line 30, the step mode acknowledgment signal on the line 38 and the step mode busy signal on the line 34 are all undefined in level. However, the standby mode enable signal on the line 44 remains asserted to let the console 4 directly keep the memory module array 8 in the standby mode.

When the system power is restored, the AC power level signal shifts to the high level from the low level at a tenth time $t_{10}$ represented by a transition point 54 after the time $t_9$. Restoration of the system power allows the DC power in the system 2 to be restored. Restoration of the DC power is indicated by the shift of the DC power level signal back to the high level at an eleventh time $t_{11}$ represented by a transition point 56 after the time $t_{10}$.

After the DC power level is brought up at the time $t_{11}$, the console 4 deasserts the system initialization signal on the line 25 and asserts the step request signal on the line 26. The standby mode enable signal remains asserted. The console 4 then asserts the system initialization signal for a short pulse period starting at a twelfth time $t_{12}$ represented by a transition point 58 after the time $t_{11}$.

After the assertion of the system initialization signal on the line 25 at the time $t_{12}$, the memory module array 8 deasserts the step mode acknowledgment signal on the line 38 at a thirteenth time $t_{13}$ represented by a transition point 60 if it is not already deasserted. The array 8 also asserts the step mode busy signal, as represented by a transition point 61 on the line 34, at the time $t_{13}$ if it is not already asserted to indicate that the array 8 cannot accept step mode commands. The standby mode enable signal must remain asserted to maintain the system in the standby mode.

To transfer to the step mode from the standby mode, the memory controller 6 must assert the step mode enable signal before the console 4 deasserts the standby mode enable signal. This is necessary to prevent the memory unit 8 from going directly into the normal mode from the standby mode, which could result in loss of data and damage to the DRAM's under certain circumstances.

The assertion of the step mode enable signal on the line 30 is shown to occur at or before a fourteenth time $t_{14}$ represented by a point 62 after the time $t_{13}$. The assertion of the step mode enable signal is in response to a scanning operation by the console 4 into the memory controller 6 between the time $t_{11}$ and the time $t_{14}$.

The console 4 then deasserts the standby mode enable signal on the line 44 at a fifteenth time $t_{15}$ represented by a transition point 64 after the time $t_{14}$ to allow the memory modules of the array 8 to enter the step mode. The array 8 then enters the step mode and informs the console 4 of this by asserting the step mode acknowledgment signal on the line 38 at a sixteenth time $t_{16}$ represented by a transition point 66. Also at the time $t_{16}$, the array 8 deasserts the step mode busy signal, represented by the transition point 67, to tell the memory controller 6 that the memory array 8 is ready to receive step mode commands.

The console 4 then deasserts the step mode request signal on the line 26 at a seventeenth time $t_{17}$ represented by the transition point 68 to inform the memory controller 6 to prepare for the normal mode. The memory controller 6 deasserts the step mode enable signal on the line 30 at an eighteenth time $t_{18}$ represented by a transition point 70 after the time $t_{17}$ to inform the memory module array 8 to exit the step mode.

The memory module array 8 asserts the step mode busy signal on the line 34 at a nineteenth time $t_{19}$ represented by a transition point 72 after the time $t_{18}$ to inform the memory controller 6 that the array 8 can no longer accept step mode commands. The array 8 deasserts the step mode acknowledgment signal on the line 38 at a twentieth time $t_{20}$ represented by a transition point 73 after the time $t_{19}$ to inform the console 4 that the array 8 is now in the normal mode. The array 8 then deasserts the step mode busy signal on the line 34 at a twenty first time $t_{21}$ represented by a transition point 74 after the time $t_{20}$ to inform the memory controller 6 that the array 8 is ready to accept normal mode DRAM operations.

Figure 3:
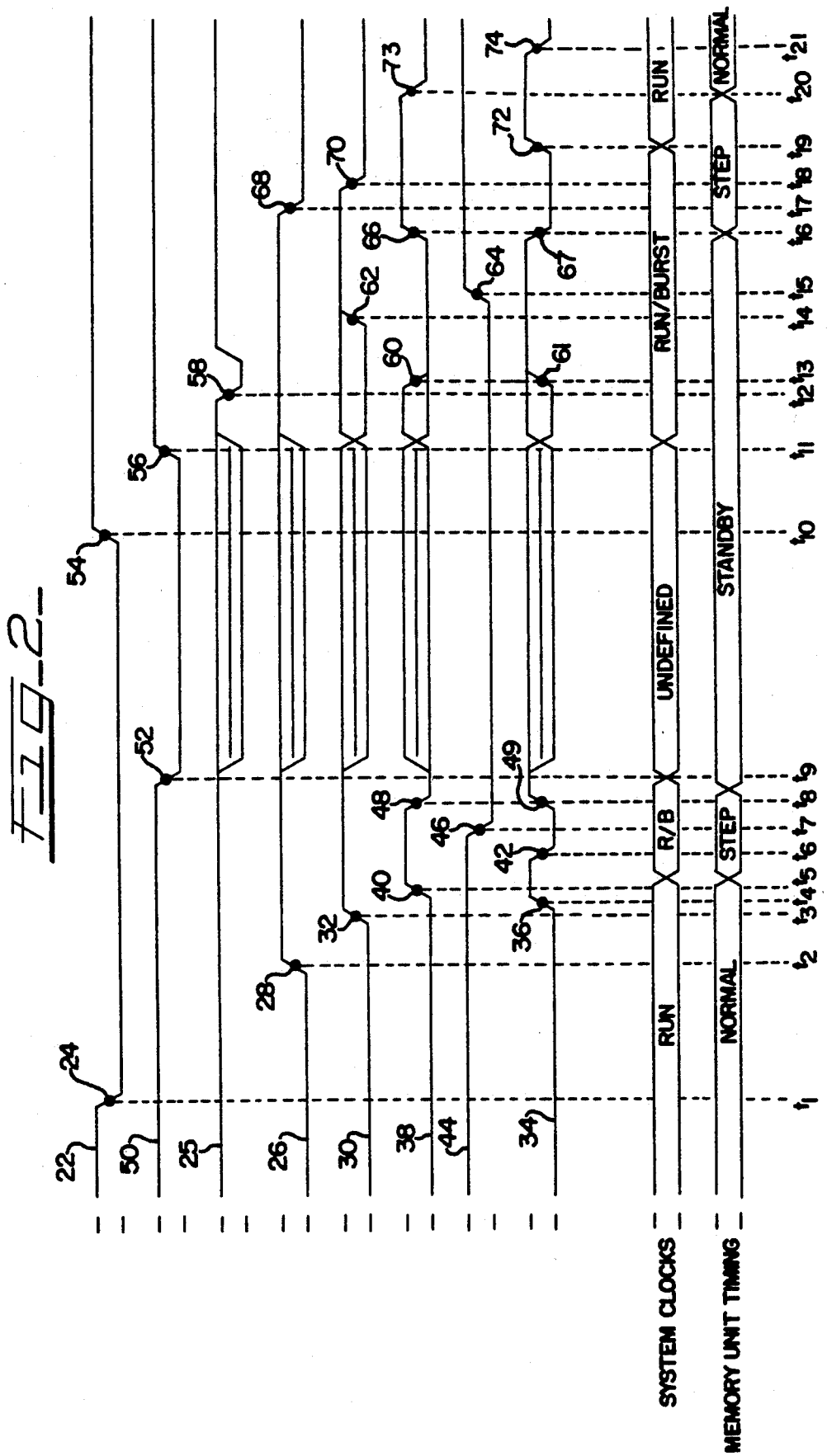
FIG. 3 is a timing diagram representing the signal levels of five of the special handshake signals between the console, the memory controller and the memory module array of the processing system shown in FIG. 1 during a complete cycle of the processing system states between the normal, step and standby modes that includes the scanning operation sequence.

FIG. 3 is a timing diagram representing the signal levels of five of the special handshake signals described above between the console 4, the memory controller 6 and the memory module array 8 of the processing system 2 shown in FIG. 1 during a complete cycle of the processing system states between the normal, step and standby modes that includes the scanning operation, shown starting in the normal mode. Also shown are the associated system clock states and memory module array modes during the scanning operation.

Line 76 represents the signal level of the step mode request signal transmitted from the console 4 to the memory controller 6. The console 4 asserts this signal at a first time $t_1$ represented by a transition point 78 to order the memory controller 6 to enable the memory module array 8 to switch to the step mode after the memory controller 6 finishes any DRAM cycle, if any is in progress.

Line 80 represents the signal level of the step mode enable signal transmitted from the memory controller 6 to the memory module array 8. The memory controller 6 asserts this signal in response to the assertion of the step mode request signal occurring at the time $t_1$. The assertion of this signal occurs at a second time $t_2$ represented by a transition point 82 after the first time $t_1$.

Line 84 represents the signal level of the step mode acknowledgment signal transmitted from the memory module array 8 to the console 4. The array 8 asserts this signal in response to the assertion of the step mode enable signal occurring at the second time $t_2$. The assertion of this signal occurs when all of its modules have switched to the step mode at a third time $t_3$ represented by a transition point 86 after the time $t_2$.

Line 88 represents the signal level of the step mode busy signal transmitted from the memory module array 8 to the memory controller 6. The array 8 asserts this signal in response to the assertion of the step mode enable signal on the line 80 occurring at the second time $t_2$ to indicate to the memory controller that it cannot receive the step mode commands. The assertion of this signal occurs at the time $t_3$, as represented by the transition point 89, and continues until the module of the array 8 is ready to accept step mode commands. It is then deasserted at a fourth time $t_4$ represented by a transition point 90 after the time $t_3$ to indicate to the memory controller 6 that the array 8 can now receive step mode commands.

Line 92 represents the signal level of the standby mode enable signal transmitted from the console 4 to the memory module array 8. This signal is asserted at a fifth time $t_5$ represented by a transition point 94 after the time $t_4$ to prepare the memory module array 8 to switch to the standby mode.

The memory module array 8 deasserts the step mode acknowledgment signal on the line 84 at a sixth time $t_6$ represented by a transition point 96 after the time $t_5$ to inform the console 4 that the memory module array 8 has switched from the step mode to the standby mode. Also at the time $t_6$, the array 8 asserts the step mode busy signal, represented by the transition point 97 on the line 88, to inform the memory controller 6 that the array 8 can no longer receive step mode commands.

When the console 4 is to initiate the step mode to leave the standby mode at a seventh time $t_7$ after the time $t_6$, it deasserts the standby mode enable signal on the line 92 as represented by a transition point 98. The memory module array 8 responds by asserting the step mode acknowledgment signal on the line 84 at an eighth time $t_8$ represented by a transition point 100 after the time $t_7$ to inform the console 4 that the array 8 has switched to the step mode. The array 8 also deasserts the step mode busy signal at the eighth time $t_8$ represented by a transition point 101 after the time $t_7$ to inform the memory controller 6 that the array 8 can receive step mode commands.

The console 4 then deasserts the step mode request signal on the line 76 at a ninth time $t_9$ represented by a transition point 102 after the time $t_8$ to inform the memory controller 6 to order the array 8 to prepare to switch from the step mode to the normal mode. The memory controller 6 responds by deasserting the step mode enable signal on the line 80 at a tenth time $t_{10}$ represented by a transition point 104 after the time $t_9$.

The memory module array 8 then asserts the step mode busy signal on the line 88 at an eleventh time $t_{11}$ represented by a transition point 106 after the time $t_{10}$ to inform the memory controller 6 that the array 8 cannot accept step mode commands. The array 8 then deasserts the step mode acknowledgment signal on the line 84 at a twelfth time $t_{12}$ represented by a transition point 107 after the time $t_{11}$ to inform the console 4 that the array 8 is now in the normal mode. The array 8 then deasserts the step mode busy signal at a thirteenth time $t_{13}$ at a transition point 108 after the time $t_{12}$ to inform the memory controller 6 that the array 8 is ready to receive normal mode DRAM operations.

As is evident from the description of the power down/power up and scanning operation timing diagrams in FIGS. 2 and 3, the state of the memory module array 8 is evident from the states of the standby mode enable and step mode enable signals. When they are both deasserted, the array 8 is in the normal mode, or soon will be. When they are both asserted, the array 8 is in the standby mode or soon will be. When the standby mode enable signal is deasserted while the step mode enable signal is asserted, the array 8 is in the step mode, or soon will be.

It will be understood that various changes in the details an arrangement of parts, systems and processes that have been described above in order to explain the nature of the present invention may be made by those skilled in the art within the principle and scope of the present invention as expressed in the appended claims.

What is claimed is:

1. A method for preserving the integrity of data stored in a memory unit of a data processing system during a power down condition in battery back-up, said memory unit having a normal data processing mode, a step mode and a standby mode of operation, said memory unit operating in said step mode or said standby mode when a memory controller in said system that is associated with said memory unit and that processes operations for a service processor unit console operating in said system is no longer under control of a system clock, said memory unit also having a clock, comprising the steps of:

switching said memory unit from said normal data processing mode into said step mode which allows said memory unit to operate on said clock for operations performed on said memory controller regardless of the state of said system clock;

switching said memory unit from said step mode into said standby mode which allows said memory unit to operate on said clock on battery back-up and allows data to be scanned into and out of said memory controller without affecting the state of said memory unit during said power down condition;

switching said memory unit from said standby mode into said step mode which allows operations to be performed on said memory controller while stopping, single stepping or bursting said system clock; and switching said memory unit back to said normal data processing mode.

2. The method recited in claim 1, wherein said step of switching said memory unit from said normal data processing mode into said step mode which allows said memory unit to operate on said clock for operations performed on said memory controller regardless of the state of said system clock further comprises the step of:

asserting a step mode request signal from said console to said memory controller to order said memory controller to enable said memory unit to switch to said step mode after said memory controller finishes any operation cycle in progress.

3. The method recited in claim 2, wherein said step of switching said memory unit from said normal data processing mode into said step mode which allows said memory unit to operate on said clock for operations performed on said memory controller regardless of the state of said system clock further comprises the step of:

asserting a step mode enable signal from said memory controller to said memory unit to enable said memory unit to switch from said normal mode to said step mode.

4. The method recited in claim 3, wherein said step of switching said memory unit from said normal data processing mode into said step mode which allows said memory unit to operate on said clock for operations performed on said memory controller regardless of the state of said system clock further comprises the step of:

asserting a step mode acknowledgement signal from said memory unit to said console to indicate to said console that said memory unit has switched to said step mode.

5. The method recited in claim 4, wherein said step of switching said memory unit from said normal data processing mode into said step mode which allows said memory unit to operate on said clock for operations performed on said memory controller regardless of the state of said system clock further comprises the step of:

asserting a step mode busy signal from said memory unit to said memory controller while said memory unit is switching to said step mode to indicate to said memory controller that said memory unit cannot yet receive commands in said step mode.

6. The method recited in claim 1, wherein said step of switching said memory unit from said step mode into said standby mode which allows said memory unit to operate on said clock on battery back-up and allows data to be scanned into and out of said memory controller without affecting the state of said memory unit during said power down condition further comprises the step of:

asserting a standby mode enable signal from said console to said memory unit to prepare said memory unit to switch to said standby mode.

7. The method recited in claim 6, wherein said step of switching said memory unit from said step mode into said standby mode which allows said memory unit to operate on said clock on battery back-up and allows data to be scanned into and out of said memory controller without affecting the state of said memory unit during said power down condition further comprises the step of:

deasserting a step mode acknowledgement signal from said memory unit to said memory controller to indicate to said memory controller that said memory unit is ready to switch to said standby mode.

8. The method recited in claim 7, wherein said step of switching said memory unit from said step mode into said standby mode which allows said memory unit to operate on said clock on battery back-up and allows data to be scanned into and out of said memory controller without affecting the state of said memory unit during said power down condition further comprises the step of:
   asserting a step mode busy signal from said memory unit to said memory controller to indicate when said memory unit can no longer receive commands in said step mode.

9. The method recited in claim 1, wherein said step of switching said memory unit from said standby mode into said step mode which allows operations to be performed on said memory controller while stopping, single stepping or bursting said system clock further comprises the step of:
   deasserting a standby mode enable signal from said console to said memory unit to indicate to said memory unit that said memory unit should exit said standby mode.

10. The method recited in claim 9, wherein said step of switching said memory unit from said standby mode into said step mode which allows operations to be performed on said memory controller while stopping, single stepping or bursting said system clock further comprises the step of:
    deasserting a step mode busy signal from said memory unit to said memory controller to indicate to said memory controller that said memory unit is ready to receive commands in said step mode.

11. The method recited in claim 10, wherein said step of switching said memory unit from said standby mode into said step mode which allows operations to be performed on said memory controller while stopping, single stepping or bursting said system clock further comprises the step of:
    deasserting a step mode request signal from said console to said memory controller to indicate that said memory controller should command said memory unit to switch from said step mode to said normal mode.

12. The method recited in claim 11, wherein said step of switching said memory unit from said standby mode into said step mode which allows operations to be performed on said memory controller while stopping, single stepping or bursting said system clock further comprises the step of:
    asserting a memory transition signal from said memory unit to said memory controller as said memory unit switches to said normal mode to indicate to said memory controller that said memory unit can no longer receive commands in said step mode.

13. The method recited in claim 12, wherein said step of switching said memory unit from said standby mode into said step mode which allows operations to be performed on said memory controller while stopping, single stepping or bursting said system clock further comprises the step of:
    asserting a system initializing signal from said console to said memory unit after power is restored to said system to indicate to said memory unit that said memory unit should terminate battery back-up operation.

14. A method for preserving the integrity of data stored in a memory unit of a data processing system during scanning operations said memory unit having a normal data processing mode, a step mode and a standby mode of operation, a memory controller associated with said memory unit of said data processing system is single-stepped, run through a sequence of steps, or stopped under control of a system clock while processing normal operations for a service processor unit console operating in said data processing system and said memory unit having a clock, comprising the steps of:
    switching said memory unit from said normal data processing mode into said step mode which allows said memory unit to operate on said clock for normal operations performed on said memory controller regardless of the state of said system clock;
    switching said memory unit from said step mode into said standby mode which allows said memory unit to operate on said clock to scan select data into said memory controller without affecting the state of said memory unit;
    switching said memory unit from said standby mode to said step mode which allows said memory controller to be single-stepped, run in a burst of steps, or stopped under control of said system clock while processing normal operations for said service processor;
    switching said memory unit from said step mode back to said standby mode to scan out the result of said normal operations processed by said memory controller after returning to said step mode; and
    switching said memory unit from said standby mode to said step mode and from said step mode to said normal data processing mode.

15. The method recited in claim 12, wherein said step of switching said memory unit from said normal data processing mode into said step mode which allows said memory unit to operate on said clock for normal operations performed on said memory controller regardless of the state of said system clock comprises the step of:
    asserting a step mode request signal from said console to said memory controller to order said memory controller to enable said memory unit to switch to said step mode after said memory controller finishes any operation cycle in progress.

16. The method recited in claim 15, wherein said step of switching said memory unit from said normal data processing mode into said step mode which allows said memory unit to operate on said clock for normal operations performed on said memory controller regardless of the state of said system clock comprises the step of:
    asserting a step mode enable signal from said memory controller to said memory unit to enable said memory unit to switch from said normal mode to said step mode.

17. The method recited in claim 16, wherein said step of switching said memory unit from said normal data processing mode into said step mode which allows said memory unit to operate on said clock for normal operations performed on said memory controller regardless of the state of said system clock comprises the step of:
    asserting a step mode acknowledgement signal from said memory unit to said console to indicate to said console that said memory unit has switched to said step mode.

18. The method recited in claim 17, wherein said step of switching said memory unit from said normal data processing mode into said step mode which allows said memory unit to operate on said clock for normal operations performed on said memory controller regardless of the state of said system clock comprises the step of:

asserting a step mode busy signal from said memory unit to said memory controller while said memory unit is switching to said step mode to indicate to said memory controller that said memory unit cannot yet receive commands in said step mode.

19. The method recited in claim 14, wherein said steps of switching said memory unit from said step mode into said standby mode which allows said memory unit to operate on said clock to scan select data into said memory controller without affecting the state of said memory unit each comprise the step of:

asserting a standby mode enable signal from said console to said memory unit to prepare said memory unit to switch to said standby mode.

20. The method recited in claim 19, wherein said steps of switching said memory unit from said step mode into said standby mode which allows said memory unit to operate on said clock to scan select data into said memory controller without affecting the state of said memory unit each comprise the step of:

deasserting a step mode acknowledgement signal from said memory unit to said memory controller to indicate to said memory controller that said memory unit is ready to switch to said standby mode.

21. The method recited in claim 20, wherein said steps of switching said memory unit from said step mode into said standby mode which allows said memory unit to operate on said clock to scan select data into said memory controller without affecting the state of said memory unit each comprise the step of:

asserting a step mode busy signal from said memory unit to said memory controller to indicate when said memory unit can no longer receive commands in said step mode.

22. The method recited in claim 14, wherein said step of switching said memory unit from said standby mode to said step mode which allows said memory controller to be single-stepped, run in a burst of steps, or stopped under control of said system clock while processing normal operations for said service processor comprises the step of:

deasserting a standby mode enable signal from said console to said memory unit to indicate to said memory unit that said memory unit should exit said standby mode.

23. The method recited in claim 22, wherein said step of switching said memory unit from said standby mode to said step mode which allows said memory controller to be single-stepped, run in a burst of steps, or stopped under control of said system clock while processing normal operations for said service processor comprises the step of:

deasserting a step mode busy signal from said memory unit to said memory controller to indicate to said memory controller that said memory unit is ready to receive commands in said step mode.

24. The method recited in claim 23, wherein said step of switching said memory unit from said standby mode to said step mode and from said step mode to said normal mode comprises the step of:

deasserting a step mode request signal from said console to said memory controller to indicate that said memory controller should command said memory unit to switch from said step mode to said normal mode.

25. The method recited in claim 14, wherein said step of switching said memory unit from said standby mode to said step mode and from said step mode to said normal mode comprises the step of:

asserting a memory transition signal from said memory unit to said memory controller as said memory unit switches to said normal mode to indicate to said memory controller that said memory unit can no longer receive commands in said step mode.

26. Apparatus for preserving the integrity of data stored in a memory unit of a data processing system during a power down condition in battery back-up, said memory unit having a normal data processing mode, a step mode and a standby mode of operation, said memory unit operating in said step mode or said standby mode when a memory controller in said system that is associated with said memory unit and that processes operations for a service processor unit console operating in said system is no longer under control of a system clock, said memory unit also having a clock, comprising:

means for switching said memory unit from said normal data processing mode into said step mode which allows said memory unit to operate on said clock for normal operations performed on said memory controller regardless of the state of said system clock;

means for switching said memory unit from said step mode into said standby mode which allows said memory unit to operate on said clock on battery back-up and allows data to be scanned into and out of said memory controller without affecting the state of said memory unit during a power down condition;

means for switching said memory unit from said standby mode into said step mode which allows normal operations to be performed on said memory controller while stopping, single stepping or bursting said system clock; and means for switching said memory unit back to said normal mode.

27. Apparatus for preserving the integrity of data stored in a memory unit of a data processing system during scanning operations, said memory unit having a normal data processing mode, a step mode and a standby mode of operation, a memory controller associated with said memory unit of said data processing system is single-stepped, run through a sequence of steps, or stopped under control of a system clock while processing normal operations for a service processor unit console operating in said data processing system and said memory unit having a clock, comprising:

means for switching said memory unit from said normal data processing mode into said step mode which allows said memory unit to operate on said clock for normal operations performed on said memory controller regardless of the state of said system clock;

means for switching said memory unit from said step mode into said standby mode which allows said memory unit to operate on said clock to scan select data into said memory controller without affecting the state of said memory unit;

means for switching said memory unit from said standby mode to said step mode which allows said memory controller to be single-stepped, run in a burst of steps, or stopped under control of said system clock while processing normal operations for said service processor;

means for switching said memory unit from said step mode back to said standby mode to scan out the result of said normal operations processed by said memory controller after returning to said step mode; and means for switching said memory unit from said standby mode to said step mode and from said step mode to said normal data processing mode.

* * * * *